United States Patent [19]
McLaughlin

[11] Patent Number: 5,642,272
[45] Date of Patent: Jun. 24, 1997

[54] APPARATUS AND METHOD FOR DEVICE POWER-UP USING COUNTER-ENABLED DRIVERS

[75] Inventor: Daniel F. McLaughlin, Dallas, Tex.

[73] Assignee: Texas Instruments Incorporated, Dallas, Tex.

[21] Appl. No.: 327,334

[22] Filed: Oct. 21, 1994

[51] Int. Cl.$^6$ .............................. H02M 7/10; G11C 7/00; H03K 3/01
[52] U.S. Cl. ............................................. 363/49; 323/901
[58] Field of Search ................................. 323/901, 908, 323/283, 284; 363/49

[56] References Cited

U.S. PATENT DOCUMENTS 5,220,534   6/1993   Redwine et al. ..................... 365/226

*Primary Examiner*—Peter S. Wong
*Assistant Examiner*—Bao Q. Vu
*Attorney, Agent, or Firm*—Mark E. Courtney; William W. Holloway; Richard L. Donaldson

[57] ABSTRACT

The secondary power supply Vbb which powers components on a semiconductor device receives power from a distributed primary power supply Vbb. During the power-up portion for the secondary power supply Vbb, a main driver amplifier 13 provides the power. After the secondary power supply Vbb has reached the desired voltage level, a standby driver amplifier 14 is used to maintain the desired voltage level. In the present invention, the main driver amplifier 13 is activated by a time base unit 21, 22 time in response activation of the primary power supply. The time base unit 21, 22 can simultaneously inactivate the standby driver amplifier 14, or the standby power supply can operate independently of the main driver amplifier 13. After a time interval sufficient to insure that the output from the secondary power supply has reached the desired voltage level, the main driver amplifier 13 is inactivated and the standby (i.e., lower power) amplifier provides the steady state power. In the preferred embodiment, the time base unit 21, 22 is implemented by an oscillator unit 21 and an oscillator counter unit 22, a predetermined number of oscillator signals determining the time interval.

20 Claims, 2 Drawing Sheets

APPARATUS AND METHOD FOR DEVICE POWER-UP USING COUNTER-ENABLED DRIVERS

BACKGROUND OF THE INVENTION

1. Field of the Invention

This invention relates generally to semiconductor devices and, more particularly, to the power supplies which are located on the substrate of the semiconductor devices and which, in turn, receive power from a distributed power source. These power supplies can be used, for example, to provide power to the storage elements of a memory array.

2. Description of the Related Art

Referring to FIG. 1, a power supply unit for providing power to a voltage terminal Vbb is shown. The power-up detect unit 11, coupled to a terminal of power supply unit Vdd, provides a signal to an input terminal of analog detector unit 12. The output terminal of analog detector unit 12 is coupled to an input terminal of amplifier 13 and can be coupled to a first input terminal of amplifier 14 (i.e., as indicated by the dashed line). A second input terminal of amplifier 14 has the standby control signal applied thereto. The output terminals of amplifier 13 and amplifier 14 are coupled to the Vbb power supply unit output terminal.

Referring to FIG. 2, a schematic diagram of the analog detector unit 12 of FIG. 1 is shown. A Vdd power supply output terminal is coupled to a source terminal of p-channel transistor 21 while gate terminal of transistor 21 is coupled to ground. A drain terminal of transistor 21 is coupled to an input terminal of amplifier 25, to a gate terminal of n-channel transistor 22, and to a drain terminal of transistor 22. A source terminal of transistor 22 is coupled to a drain terminal of n-channel transistor 23 and to a gate terminal of transistor 23. The source terminal of transistor 23 is coupled to the substrate.

The operation of the power supply unit can be understood with reference to FIG. 3. When the Vdd power supply output terminal has voltage applied thereto beginning at t0, the POWER-UP DETECTOR (PUD) signal remains at a zero level until Vdd reaches a predetermined level. At the predetermined Vdd voltage level, occurring at time t1, the POWER-UP DETECTOR signal jumps an incremental amount and thereafter rises as a function of the rise in the Vdd voltage, e.g., in an unregulated supply. At time t2, the Vdd voltage has reached a steady state value and becomes a constant voltage. Similarly, the POWER-UP DETECTOR signal reaches a steady state value at this time. Because Vdd voltage is applied to each of the components of the circuit in FIG. 1, the voltage Vbb at the output terminal begins to fall at some time after the application of Vdd voltage. The fall of the Vbb voltage can also be triggered by the POWER-UP DETECT signal. The voltages S1 or S1' from the analog detector unit can be applied prior to the application of the Vdd voltage or can be generated by the application of the Vdd voltage (shown by dotted lines on the curves labelled S1 and S1') and illustrate two alternative and undesirable situations. In the first situation, the trip-voltage 1 Vt (the voltage level determined by the analog detector 12) is above the desired Vbb voltage level (for a negative going Vbb voltage). In the second situation, the trip-voltage 2 Vt is below the desired Vbb voltage level (for a negative going Vbb voltage). When the trip-voltage of the analog detector has the value 1 Vt, i.e., above the desired voltage level, then when Vbb crosses the trip-level 1 Vt, the main driver amplifier 13 is disabled. (The standby amplifier 14 is shown coupled to the voltage S1 or S1' by a dotted line indicating that the operation of the standby amplifier can already be enabled or can be enabled by the S1 or S1' signal.) This activity is illustrated by S1 in FIG. 3. The standby amplifier 13, having less power than the main driver amplifier 14, results in a longer time to reach the desired level. The time at the lower power level is indicated by the length of time, d, shown in FIG. 3. In the second situation where the trip-level is lower than the desired Vbb level, the various voltage levels can stabilize in such a manner that the main driver amplifier is never cut off as illustrated by the S1' voltage level in FIG. 3. In the first alternative situation, the desired Vbb voltage level is not achieved in an acceptable amount of time. In the second alternative situation, the main driver amplifier is never disabled and, consequently, unnecessary power is consumed.

A need has therefore been felt for apparatus and an associated method which would provide for the power-up of a supply voltage whereby the desired level would be reached in an timely manner. Similarly, the apparatus and method would not result in configurations wherein the main driver voltage would be unable to achieve the desired voltage. Expressed in an alternative manner, a need has been felt for apparatus and an associated method in which the power-up of a supply voltage was not limited by the discrete increments of an analog detector.

SUMMARY OF THE INVENTION

The aforementioned and other features are provided, according to the present invention, by replacing the discrete value of an analog detector, the discrete value determining when the power source activating a voltage terminal in a power-up mode is transferred from a main driver amplifier to a lower power standby driver amplifier, with a time base unit. The time base unit maintains the main driver amplifier as the power source for the power supply output terminal for a predetermined period of time. After the predetermined period of time has expired, the main amplifier is removed as a power source for the voltage terminal. The standby driver amplifier can either be enabled at this time or the standby amplifier can remain enabled when the main amplifier and the standby amplifier are independent. In the preferred embodiment, the time base unit is provided by an oscillator unit and an oscillator counter unit. The oscillator counter unit counts a predetermined number of signals from the oscillator and, when that predetermined number has been identified, the power applied to the voltage terminal is changed from the main driver amplifier to the standby driver amplifier. In this manner, the problem of premature transfer of the power source at the voltage terminal is avoided and the problem of continuous activation of the main driver amplifier is avoided.

These and other features of the present invention will be under stood upon reading of the following description along with the Figures.

DESCRIPTION OF THE PREFERRED EMBODIMENT(S)

Figure 1:
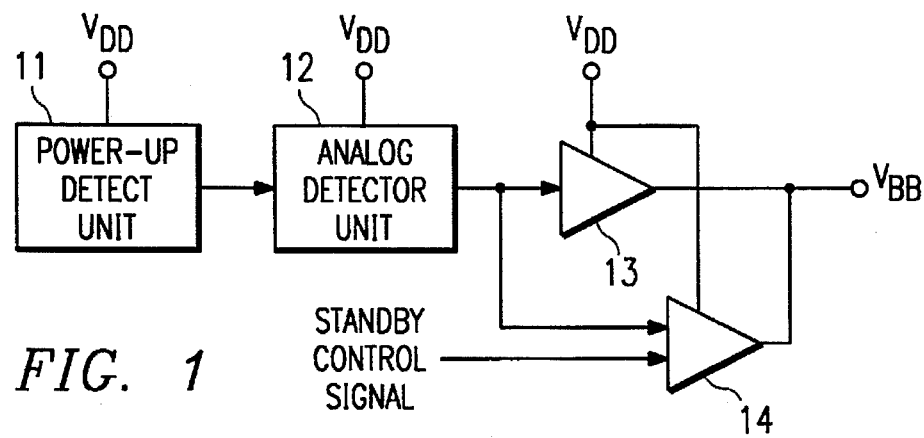
FIG. 1 is a block diagram of a secondary power supply unit according to the related art.
Figure 2:
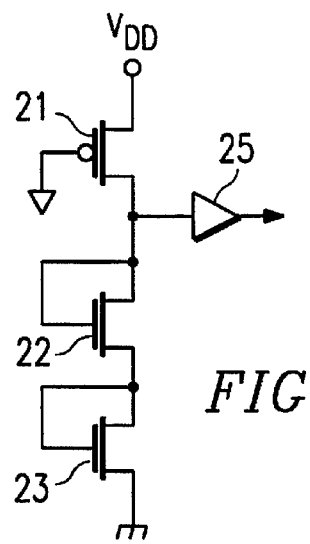
FIG. 2 is a simplified circuit diagram of an analog detector used in FIG. 1.
Figure 3:
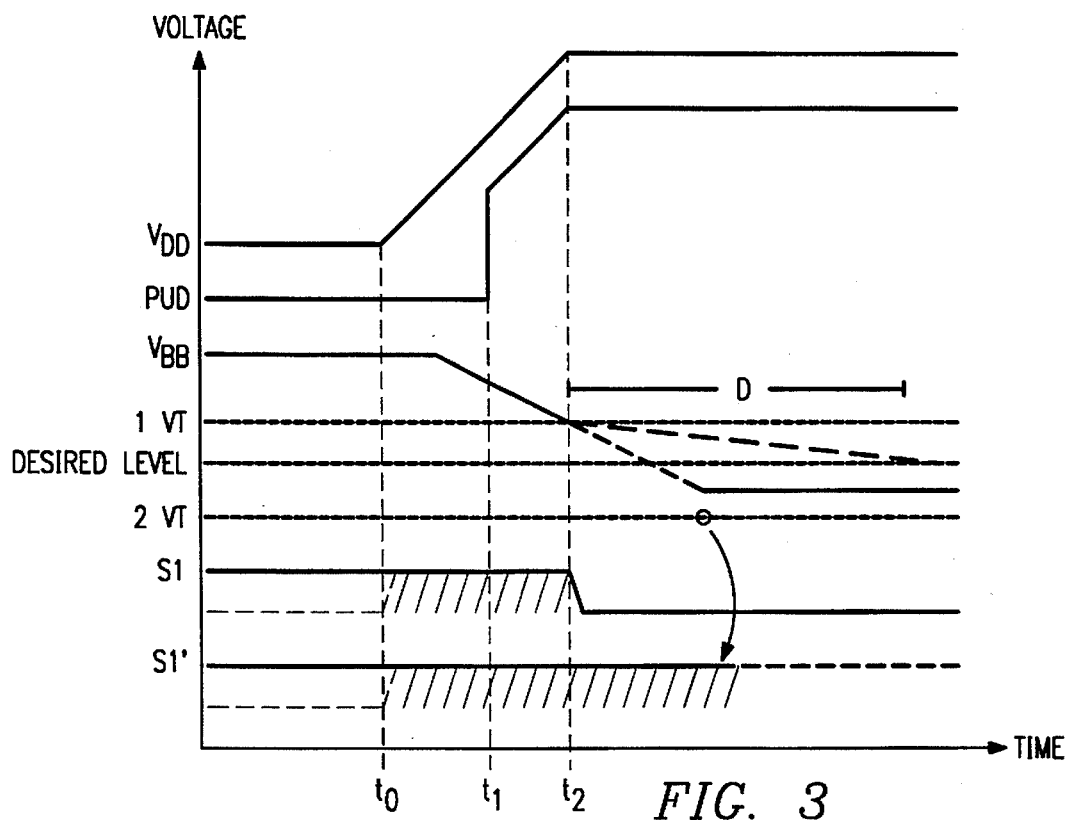
FIG. 3 is a diagram of signals at various node points for the secondary power supply unit of FIG. 1.

1. Detailed Description of the Drawings FIG. 1, FIG. 2, and FIG. 3 have been discussed in relation to the related art.

Figure 4:
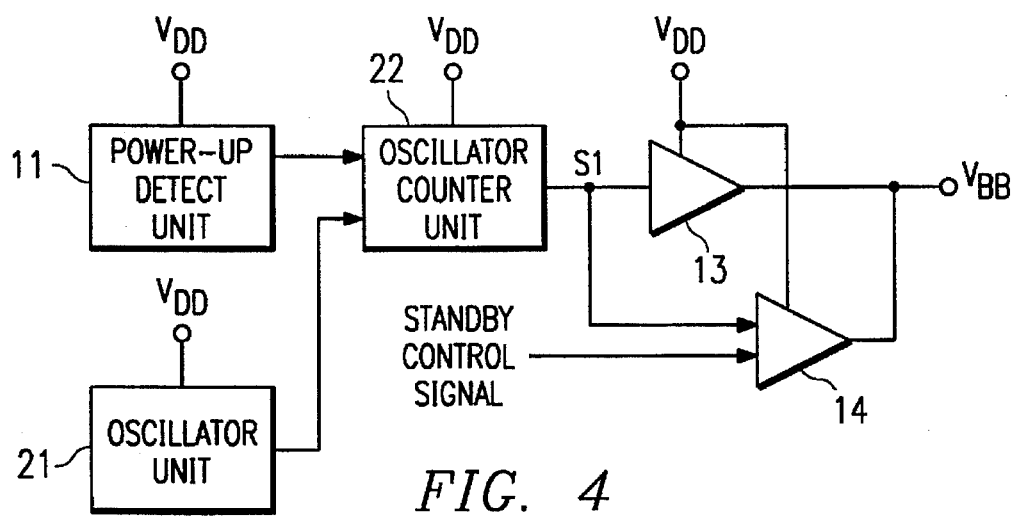
FIG. 4 is a block diagram of a secondary power supply unit according to the present invention.

Referring next to FIG. 4, a block diagram of the secondary power supply unit according to the present invention is shown. A power-up detect unit 11 is coupled supply terminal Vdd. The power-up detect unit 11 applies a POWER-UP DETECT signal to oscillator counter unit 22. Oscillator counter unit 22 also receives a signal from oscillator unit 21. The output signal from oscillator counter unit 22 is applied to an input terminal of amplifier 13 and to a first terminal of amplifier 14. A second input terminal of amplifier 14 receives an enabling standby control signal. The conducting path from the output terminal of oscillator counter unit 22 to the input terminal of amplifier 14 is shown with a dashed line. The dashed line is meant to indicate that, in some configurations, the operation of amplifier 13 and the operation of amplifier 14 are independent. The output terminals of amplifier 13 and amplifier 14 are coupled to the Vbb power supply output terminal and provide the power to the terminal.

2. Operation of the Preferred Embodiment(s)

Figure 5:
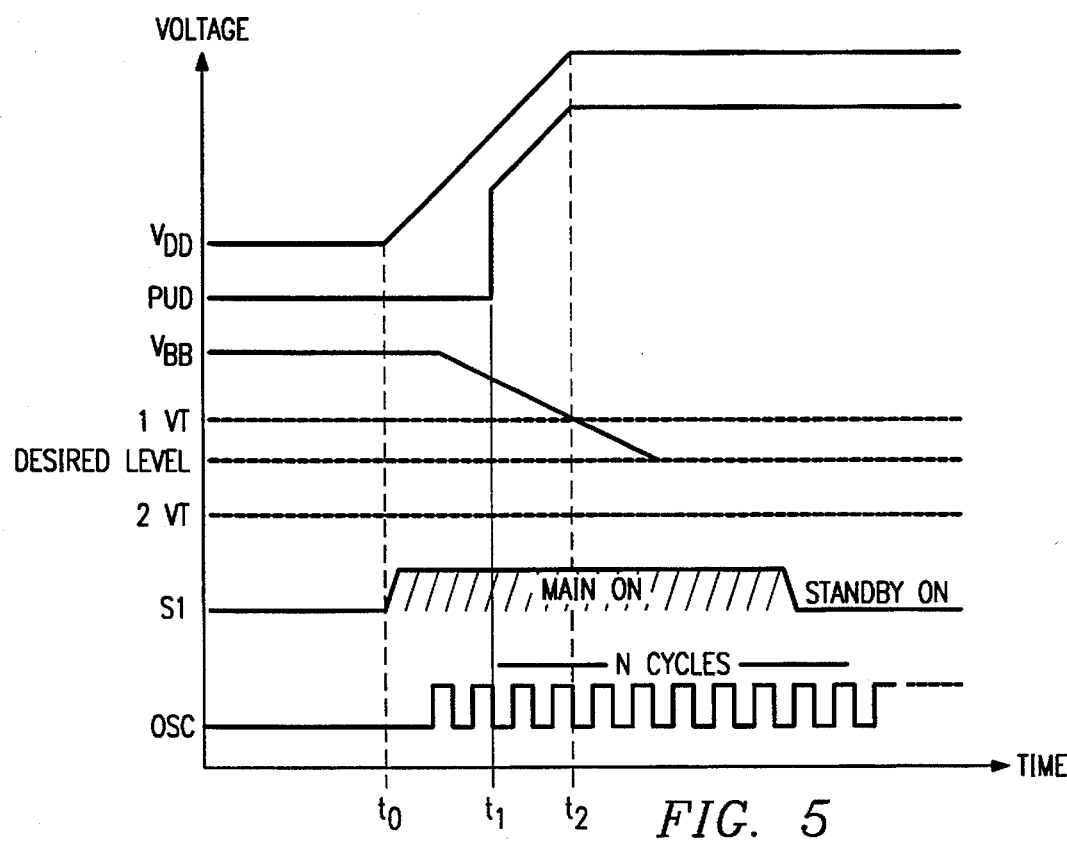
FIG. 5 is a block diagram of the signals at selected node points during power-up of the power supply unit according to the present invention.

The operation of the secondary power supply unit of the present invention can be best understood by reference to FIG. 5. As was discussed with respect to FIG. 3, when the Vdd power supply is powered up, the power-up detect unit applies a POWER-UP DETECT signal to oscillator unit 22 when the Vdd voltage reaches a predetermined level. Thereafter, the POWER-UP DETECT signal is related to the rise of the Vdd terminal voltage and the POWER-UP DETECT signal assumes a steady state value when the Vdd voltage reaches a steady state value. The oscillator unit 21 will typically be activated during the power-up operation and the signals from the oscillator unit 21 will be present in advance of the activation of the oscillator counter unit 22. The oscillator counter unit 21 is activated by the POWER-UP DETECT signal. Upon activation, the oscillator counter unit 22 will generate the signal S1. The S1 signal will activate the main driver amplifier 13 and can inactivate the standby driver amplifier 14 provided that the two amplifiers are configured to have related operations. The main driver amplifier 13, once activated, will deliver power to the Vbb terminal until inactivated. The oscillator counter unit 22 then counts predetermined number (n in FIG. 5) of oscillator pulses. Once the predetermined number of pulses has been counted, then the S1 signal is removed from the main driver amplifier 13, thereby inactivating the main driver amplifier 13. The removal of the S1 signal simultaneously from the standby driver amplifier 14 can activate amplifier 14 when the main driver amplifier and the standby driver amplifier are both controlled by voltage S1. (The signal S1 can be represented by a first logic level and the removal of the signal S1 can be represented by the complement of the first signal level.) Power is thereafter provided to the terminal Vbb at a reduced level.

The number of counts from the oscillator unit 21 which determines the inactivation of main driver amplifier 13 and, in certain implementations, the activation of standby driver amplifier 14 is selected to insure that the desired voltage level is reached as rapidly as possible. The oscillator counter unit 22 is typically programmed in such a manner that the S1 signal is removed after more counts than are required to insure that the desired operating voltage Vbb is reached before the inactivation of the main driver amplifier. By judicious selection of the number of counts required for the change in amplifiers, the power-up circuit provides that the desired voltage level is reached while also providing that the main driver amplifier does not continue to supply power the voltage terminal longer than is necessary to achieve the desired voltage level.

While the invention has been described with particular reference to the preferred embodiment, it will be under stood by those skilled in the art that various changes may be made and equivalents substituted for elements of the preferred embodiment without departing from the invention. For example, the present invention has been described with particular reference to an oscillator and an oscillator counter unit. However, the technique for insuring that the desired voltage level is reached before the change in amplifiers powering the terminal is made can include any time base device which provides a signal after a sufficient time for the generated voltage to reach the desired level. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A secondary power supply responsive to a primary power supply, said secondary power supply comprising:
    a first amplifier responsive to a first signal for providing power for said secondary power supply;
    a second amplifier responsive to a second signal for providing power for said secondary power supply; and
    a time base unit, said time base unit generating said first signal in response to a power-up of said primary power supply, said time base removing said first signal after a predetermined time;
    wherein said second amplifier provides the power for said secondary power supply after said predetermined time interval.

2. The secondary power supply of claim 1 wherein said time base unit provides said first signal for a time interval sufficient for a voltage of said secondary power supply to reach a preestablished level.

3. The secondary power supply of claim 1 wherein said time base unit generates said second signal after said first signal is removed.

4. The secondary power supply of claim 3 wherein said first signal activates said first amplifier and inactivates said second amplifier and wherein said said second signal activates said second amplifier and inactivates said first amplifier.

5. The secondary power supply of claim 2 wherein said time base unit includes:
    an oscillator unit; and
    a oscillator counter unit, said time interval being determined by a preselected number of signals from said oscillator unit.

6. The secondary power supply of claim 5 further comprising a power-up detect unit for providing an activation signal to said oscillator counter unit when said first power supply is in a power-up mode.

7. A method for providing a power-up mode for a secondary power supply, said method comprising the steps of:
    in response to a power-up of a primary power supply, activating a first driver amplifier to provide power to an output terminal of said secondary power supply;

after a predetermined period of time, inactivating said first driver amplifier; and by means of a second driver amplifier, providing power to said output terminal after said first driver amplifier is inactivated.

8. The method of claim 7 wherein said step of activating a first driver amplifier step includes the step of increasing or decreasing a voltage of said output terminal to a preestablished level.

9. The method of claim 8 wherein said predetermined period of time is determined by the step of counting the output signals of an oscillator unit.

10. The method of claim 9 wherein said counting step includes the step of activating a counter unit when said first driver amplifier is activated.

11. A secondary power supply responsive to a primary power supply, said secondary power supply having first driver amplifier for providing power during the power-up mode of secondary power supply and a second driver amplifier for providing power at least after a desired voltage has been reached, wherein the improvement comprises;

a time base unit, said time base unit determining a predetermined period of time after which said first driver amplifier is inactivated, said second amplifier providing power for said secondary power supply after inactivation of said first driver amplifier.

12. The secondary power supply of claim 11 wherein said time base unit includes an oscillator unit and an oscillator counter unit, said oscillator counter unit being activated by a first signal, said predetermined period of time being determined by a number of oscillator unit signals counted by said oscillator counter unit after said first signal.

13. The secondary power supply of claim 12 further comprising a power-up detector unit, said power-up detector unit generating said first signal when said primary power supply is in a power-up mode.

14. The secondary power supply of claim 11 wherein said time base unit generates a signal activating said second amplifier after said predetermined period of time.

15. A secondary power supply for providing a preselected voltage level in response to a power-up mode of a primary power supply, said secondary power supply comprising:

a first amplifier for powering-up an output terminal of said secondary power supply to said preselected voltage level;

a second amplifier for maintaining said output terminal at said preselected voltage level;

a detector unit for providing a first signal during said power-up mode of said primary amplifier;

a time base unit providing a first activation signal to said first amplifier in response to said first signal, said time base unit removing said first activation signal after a predetermined time period.

16. The secondary amplifier of claim 15 wherein said time base unit includes an oscillator unit and an oscillator counter unit, said oscillator counter unit counting signals from said oscillator unit, said predetermined time period determined by a preselected number of signals from said oscillator unit.

17. The secondary power supply of claim 16 wherein said time base unit generates a second signal for activating said second amplifier after said predetermined time period.

18. The secondary power supply of claim 17 wherein said said first activation signal activates said first amplifier and inactivates said second amplifier and wherein said second activation signal.

19. The secondary power supply of claim 15 wherein said predetermined time period is selected to insure that said first amplifier has raised a voltage level of said output terminal to said desired voltage level.

20. The secondary power supply of claim 15 wherein said secondary power supply supplies power to an integrated circuit.

* * * * *